United States Patent [19]
Scaccianoce

[11] Patent Number: 5,949,122
[45] Date of Patent: Sep. 7, 1999

[54] INTEGRATED CIRCUIT WITH A DEVICE HAVING A PREDETERMINED REVERSE CONDUCTION THRESHOLD AND A THERMAL COMPENSATION DEVICE WITH VBE MULTIPLIERS

[75] Inventor: Salvatore Scaccianoce, Riposto, Italy

[73] Assignee: Co.Ri.M.Me-Consorzio per la Ricerca Sulla Microelettonica Nel Mezzogiorno, Catania, Italy

[21] Appl. No.: 08/854,452

[22] Filed: May 12, 1997

[30] Foreign Application Priority Data

May 14, 1996 [EP] European Pat. Off. .............. 96830276

[51] Int. Cl.$^6$ ..................................................... H01L 31/58
[52] U.S. Cl. ........................... 257/469; 257/577; 327/513
[58] Field of Search ..................................... 257/469, 470, 257/577, 603; 327/513; 330/289

[56] References Cited

U.S. PATENT DOCUMENTS

| | | | |
|---|---|---|---|
| 3,497,821 | 2/1970 | Rongen et al. ........................... | 330/38 |
| 3,723,776 | 3/1973 | Schulz ...................................... | 307/318 |
| 3,953,254 | 4/1976 | Voldman .................................. | 148/175 |
| 4,749,889 | 6/1988 | Lagoni et al. ........................... | 307/491 |

FOREIGN PATENT DOCUMENTS

| | | |
|---|---|---|
| 0 382 504 | 8/1990 | European Pat. Off. . |
| 2 854 901 | 7/1979 | Germany . |
| 2 123 635 | 2/1984 | United Kingdom . |

*Primary Examiner*—Sara Crane
*Attorney, Agent, or Firm*—Jenkens & Gilchrist, P.C.

[57] ABSTRACT

A monolithic, integrated semiconductor circuit comprising a high-voltage device (210) with a predetermined reverse-conduction threshold comprising a chain of zener diodes (220–240). Device 210 is connected in series with a thermal compensation device (250) constituted by a plurality of Vbe multipliers connected in series with one another. Each of the Vbe multipliers is formed by a resistive divider (R1$i$, R2$i$) and a low-voltage transistor (T$i$) or two or more low-voltage transistors in a Darlington configuration.

15 Claims, 7 Drawing Sheets

INTEGRATED CIRCUIT WITH A DEVICE HAVING A PREDETERMINED REVERSE CONDUCTION THRESHOLD AND A THERMAL COMPENSATION DEVICE WITH VBE MULTIPLIERS

FIELD OF THE INVENTION

The present invention relates to monolithic integrated semiconductor circuits.

BACKGROUND OF THE INVENTION

Devices with predetermined reverse-conduction thresholds are used in various applications in order to limit the maximum voltage which can be applied between two nodes of a circuit. A typical example is one or more zener diodes connected in series (such as a zener chain). As is known, in a zener diode, when the reverse voltage applied between the anode and the cathode exceeds a certain threshold value (Vz) the diode becomes conductive in reverse with a variable current and a substantially constant voltage. This reverse threshold voltage, known as the zener voltage, varies from a few volts to a few tens or hundreds of volts. A device with a predetermined reverse-conduction threshold can also be formed with the use of a bipolar transistor with an open base taken between the emitter and the collector, making use of the reversible breakdown, or "punch-through," effect of the base, or of a diode the conduction characteristic of which, although not based on the zener effect, is similar to that of a zener diode, that is, a predetermined, non-destructive breakdown threshold voltage like most diodes with avalanche reverse-breakdown junctions.

In order to limit the maximum voltage which can be applied between two nodes of a circuit, a chain of zener diodes having a total reverse threshold voltage equal to the voltage which is not be to exceeded is inserted between them. As long as the voltage applied between the two nodes remains below this value, the zener diodes behave as an open circuit. When the voltage exceeds the reverse threshold voltage of the zener chain, however, the zener diodes become conductive, maintaining a substantially constant voltage at the terminals of the zener chain.

These devices with predetermined reverse-conduction thresholds are often used in power applications in which the voltage which has to be maintained at the two nodes of the circuit reaches high values, typically greater than 50V (for example, 400V). An example of these applications is electronic ignitions implemented by integrated circuits. Such a circuit comprises a power transistor used as a switch for the switched supply of a load with currents which may be very high. When the load of the transistor is inductive, the opening of the switch, that is, the instantaneous change from the conductive state to the cut-off state of the transistor, causes a transitory surge voltage condition between the collector and emitter terminals of the power transistor. This surge voltage may also be several volts higher than the supply voltage of the transistor and may reach values and durations such as to exceed the safety limits set by the structural characteristics of the transistor. In these applications, a protection device implemented by a zener diode or a chain of zener diodes is commonly inserted between the collector and the base of the power transistor.

When the collector-emitter voltage increases as a result of the change from the conductive to the cut-off condition, and until the reverse-conduction value of the zener chain is reached, a current is injected into the base of the transistor. The transistor therefore becomes conductive again and discharges to itself the energy stored by the inductive load.

In a high-voltage device with a predetermined reverse-conduction threshold, the value of the reverse threshold voltage is highly dependent upon the temperature. For example, in the case of a high-voltage zener diode, the reverse threshold voltage varies with temperature because of the high thermal drift of these components. In particular, the reverse threshold voltage increases as the temperature increases so that the temperature coefficient of a high-voltage zener diode, that is, the ratio between the reverse threshold-voltage variation and the temperature variation (dVz/dT) is positive. For example, a zener diode may demonstrate a thermal drift of 0.1% per ° C. (1 mV/V° C.); this means that, for a 400V chain of zener diodes there is a variation of 400 mV/° C. This phenomenon is the source of inaccuracies which may be unacceptable in many applications.

A technique known in the art for the thermal compensation of a zener chain is that of the use of one or more diodes placed in series with the zener chain so that they are polarized directly during the reverse-conduction stage of the zener diodes. The threshold voltage of a diode (Vbe) in fact decreases as the temperature increases, so that the temperature coefficient of a diode (dvbe/dT) is negative; a diode having a threshold voltage of 0.7V typically has a variation of −2 mv/° C. It is therefore possible, by a suitable circuit design, to compensate for the increase of the reverse threshold voltage of the zener diodes with temperature by a corresponding equal variation, with the opposite sign, of the threshold voltage of the compensation diodes.

However, this solution cannot easily be used for high-voltage devices with predetermined conduction thresholds produced in integrated form, because of the very high number of compensation diodes required. For example, a reverse-conduction threshold device comprising a chain of high-voltage zener diodes and a series of compensation diodes which has to maintain a constant voltage of 400V will be considered. If the reverse threshold voltage of the zener chain is indicated Vzc and the number of compensation diodes connected in series therewith is indicated K:

$$Vzc + K \cdot Vbe = 400V$$

In order to achieve full temperature compensation of the device, the variation of the voltage at its terminals with variations in temperature must be zero, that is:

$$\frac{dVz}{dT} + K\frac{dVbe}{dT} = 0$$

Upon the assumption that Vbe=700 mV, dVbe/dT=−2 mv/° C., dVzc/dT=1 mV·Vzc:

$$1 \cdot 10^{-3} \cdot Vzc - 2 \cdot 10^{-3} \cdot K = 0$$

from which, by substituting Vzc=400−K·0.7:

$$1 \cdot 10^{-3} \cdot 400 - 1 \cdot 10^{-3} \cdot K \cdot 0.7 - 2 \cdot 10^{-3} \cdot K = 0$$

$$2.7 \cdot 10^{-3} \cdot K = 1 \cdot 10^{-3} \cdot 400$$

and hence:

$$K = 148$$

The value of the reverse threshold voltage of the zener chain is consequently:

$$Vz = 400 - 148 \cdot 0.7 = 296.4 V$$

Thus, in a device with a reverse threshold voltage of 400V, almost 100V has to be attributed to the compensation diodes by the insertion of 148 diodes in series with the zener chain.

This solution involves the occupation of an excessive area of the chip of the monolithic integrated circuit. Moreover, it requires considerable care in production in order to prevent structural current leakages between the various integrated diodes; this results in the occupation of further area. Moreover, each compensation diode has to be of a size such as to have an adequate area and dynamic resistance for the working current of the zener chain; for example, in the case of the electronic-ignition integrated circuit described above, the thermal-compensation diodes have to be able to withstand the base current necessary to switch the power transistor on again.

SUMMARY OF THE INVENTION

The problems of the prior art are avoided by the present invention by providing a monolithic semiconductor circuit comprising a device with a predetermined reverse-conduction threshold, and a thermal compensation device for the reverse-conduction threshold device, connected in series therewith. The thermal-compensation device comprises a plurality of Vbe multipliers connected in series with one another, each of the Vbe multipliers comprising a resistive divider comprising first and second resistors connected in series between a first terminal and a second terminal of the Vbe multiplier and a first transistor having an emitter terminal and a collector terminal connected, respectively, to the first and second terminals of the Vbe multiplier, and a base terminal connected to an intermediate tap of the divider.

BRIEF DESCRIPTION OF THE DRAWINGS

Various embodiments of the present invention will now be described by way of examples, with reference to the appended drawings, in which.

DETAILED DESCRIPTION OF A PREFERRED EMBODIMENT OF THE INVENTION

Figure 1:
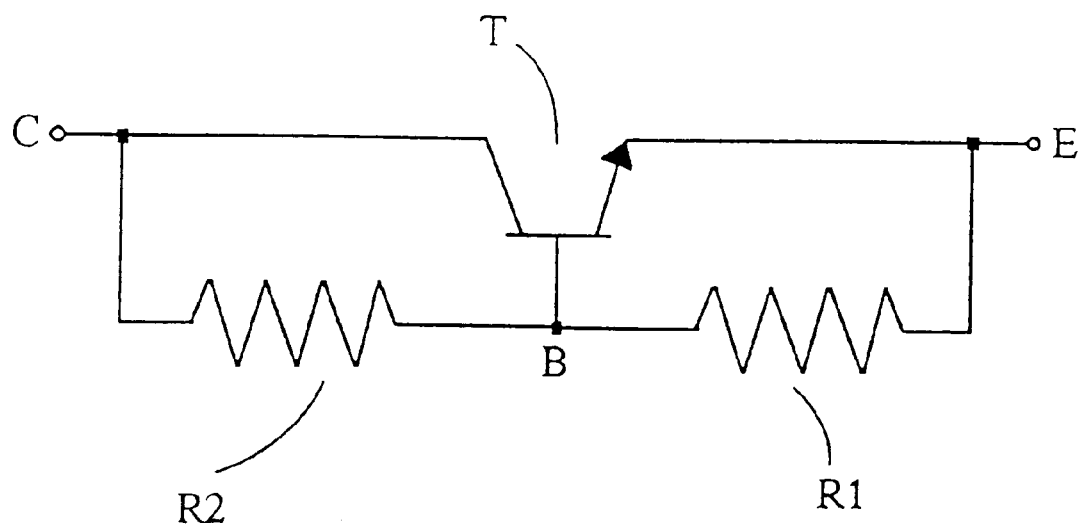
FIG. 1 is a circuit diagram of a Vbe multiplier.

With reference now to the drawings, FIG. 1 is a circuit diagram of a Vbe multiplier. For simplicity of description, reference will be made below to NPN transistors; however, PNP transistors are equally applicable. A Vbe multiplier comprises a transistor T having a collector terminal C, an emitter terminal E, and a base terminal B. A first resistor R1 is connected between the emitter terminal E and the base terminal B and a second resistor R2 is connected between the collector terminal C and the same base terminal B.

The circuit shown in the drawing produces a voltage drop Vce between its terminals C and E, which depends upon the value of the voltage Vbe of the transistor T and upon the resistances of the resistors R1 and R2. In particular, the current in the resistor R1 is:

$$Ir1 = Vbe/R1$$

If the base current of the transistor T is disregarded, the current in the resistor R2 is equal to that passing through the resistor R1, so that:

$$Vce = Ir1 \cdot (R1 + R2)$$

$$Vce = Vbe \cdot (1 + R2/R1)$$

A Vbe multiplier can thus be used as a thermal compensation device for a zener chain if the sizes of the two resistors R1 and R2 are suitable to achieve the desired voltage value. With reference to the previous example, the voltage Vce has to be 100V; if Vbe=0.7V:

$$100 = 0.7 \cdot (1 + R2/R1)$$

from which the ratio between the resistances of the two resistors R1 and R1 has to be:

$$R2/R1 = 141.8$$

Clearly, since the voltage between the collector terminal and the base terminal of the transistor T is practically equal to the voltage supplied by the Vbe multiplier, (if the voltage Vbe is disregarded) it is necessary to use a high-voltage transistor having a collector-base junction breakdown voltage with open emitter ($Bv_{cbo}$) greater than this value.

However, this solution has some disadvantages. First of all, the resistor R2 has to be a high-voltage resistor since it has to withstand a voltage practically equal to that supplied by the Vbe multiplier. This resistor takes up a considerable area in the chip constituting the integrated circuit. Moreover, its production requires surface protection devices, or "field plates," with consequent further waste of area.

Moreover, the ratio between the resistances of the two resistors R1 and R1 is very high (more than 140 in the example given above). It is known that, in an integrated circuit, it is quite difficult to produce resistors of very different values with a good degree of precision in their ratio; it is therefore difficult to produce a Vbe multiplier which provides precisely the voltage necessary for compensation of the zener chain.

Figure 2:
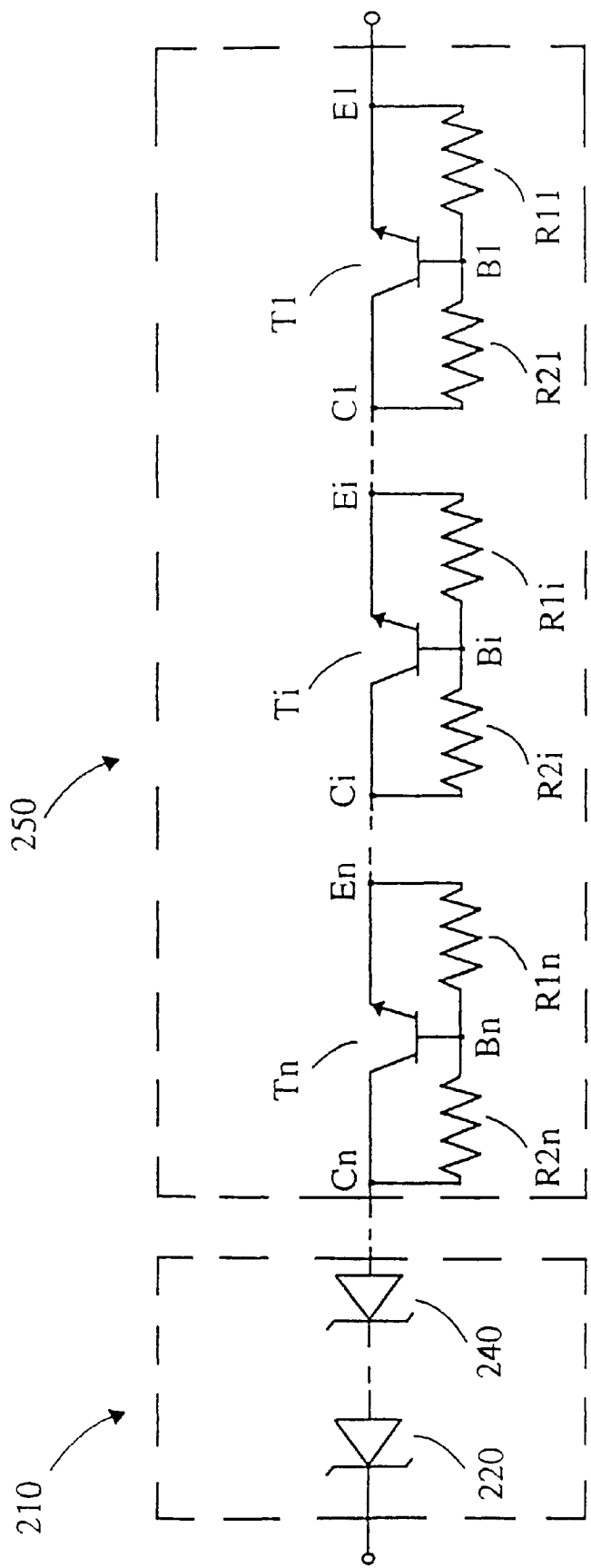
FIG. 2 is a circuit diagram corresponding to a first embodiment of the present invention.

With reference now to FIG. 2, this shows a circuit diagram corresponding to a first embodiment of the present invention. The device shown in the drawing comprises a high-voltage device 210 with a predetermined reverse-conduction threshold constituted, in this embodiment, by a chain of zener diodes 220–240 connected in series. A thermal compensation device 250 connected in series with the high-voltage predetermined reverse-conduction threshold device is constituted by a plurality of Vbe multipliers in series, each comprising a low-voltage transistor; typically, this transistor has a breakdown voltage $Bv_{cbo}$ below 50V (commonly 20V). Clearly, the predetermined reverse-conduction threshold device 210 may also be connected in series with the thermal compensation device 250 in a manner other than that shown in the drawing. For example, one or more of the Vbe multipliers constituting the thermal compensation device 250 may be inserted between each pair of adjacent zener diodes.

In particular, the circuit shown in the drawing comprises n Vbe multipliers; the i-th Vbe multiplier is constituted by a low-voltage transistor Ti and by a resistive divider formed by two resistors $R1i$ and $R2i$. The terminals of the resistive divider $R1i$–$R2i$ constitute the terminals of the Vbe multiplier to which the emitter terminal Ei and the collector terminal Ci of the transistor Ti are connected, its base terminal Bi being connected to the intermediate tap of the resistive divider. In other words, the first resistor $R1i$ is connected between the emitter terminal Ei and the base terminal Bi of the transistor Ti and the second resistor $R2i$ is connected between the collector terminal Ci and the same base terminal Bi of the transistor Ti. The n Vbe multipliers are connected in series with one another; in particular, the collector and emitter terminals of the transistor Ti are connected, respectively, to an emitter terminal of a transistor Ti+1 and to a collector terminal of a transistor Ti−1 (not shown in the drawing). The emitter terminal E1 of the first transistor T1 and the collector terminal Cn of the last transistor Tn constitute the terminals of the thermal compensation device.

The number of Vbe multipliers used depends upon the total voltage required and upon the open-emitter, collector-base junction breakdown voltage ($Bv_{cbo}$) of the individual low-voltage transistors. With reference to the previous example, the voltage $Vc_ne_1$ should be 100V; if the application of a maximum voltage of 12.5V to each transistor is considered (upon the assumption, for example, that the breakdown voltage $Bv_{cbo}$ is 20V), in this example, 8 Vbe multipliers are required.

Considering the single Vbe multiplier constituted by the low-voltage transistor Ti and by the resistors $R1i$ and $R2i$, in this example, the voltage supplied thereby has a value of 12.5V and therefore:

$$12.5 = 0.7 \cdot (1 + R2i/R1i)$$

from which, the ratio between the resistances of the two resistors $R2i$ and $R1i$ has to be:

$$R2i/R1i = 16.8$$

In the solution according to the present invention, the ratio between the resistances of the two resistors $R2i$ and $R1i$ is therefore much lower than that of the structure using a single high-voltage transistor. It is therefore possible to form the various resistors with a good degree of precision in the ratios between them, producing a thermal compensation device which provides precisely the voltage necessary to compensate the zener chain.

With regard to the values of the resistances of the two resistors $R1i$ and $R2i$, the resistor $R1i$ is of a size such that the base current of the transistor Ti is negligible in comparison with that flowing in the resistor $R1i$ and so that the voltage drop therein caused by any currents due to structural leakages of the circuit is less than the threshold voltage Vbe of the transistor Ti so as to prevent undesired switching-on thereof. Typical values for the resistor $R1i$ are from a few hundreds of $\Omega$ to a few k$\Omega$. The resistance of the resistor $R2i$ therefore has values between a few k$\Omega$ and a few tens of k$\Omega$.

Figure 3:
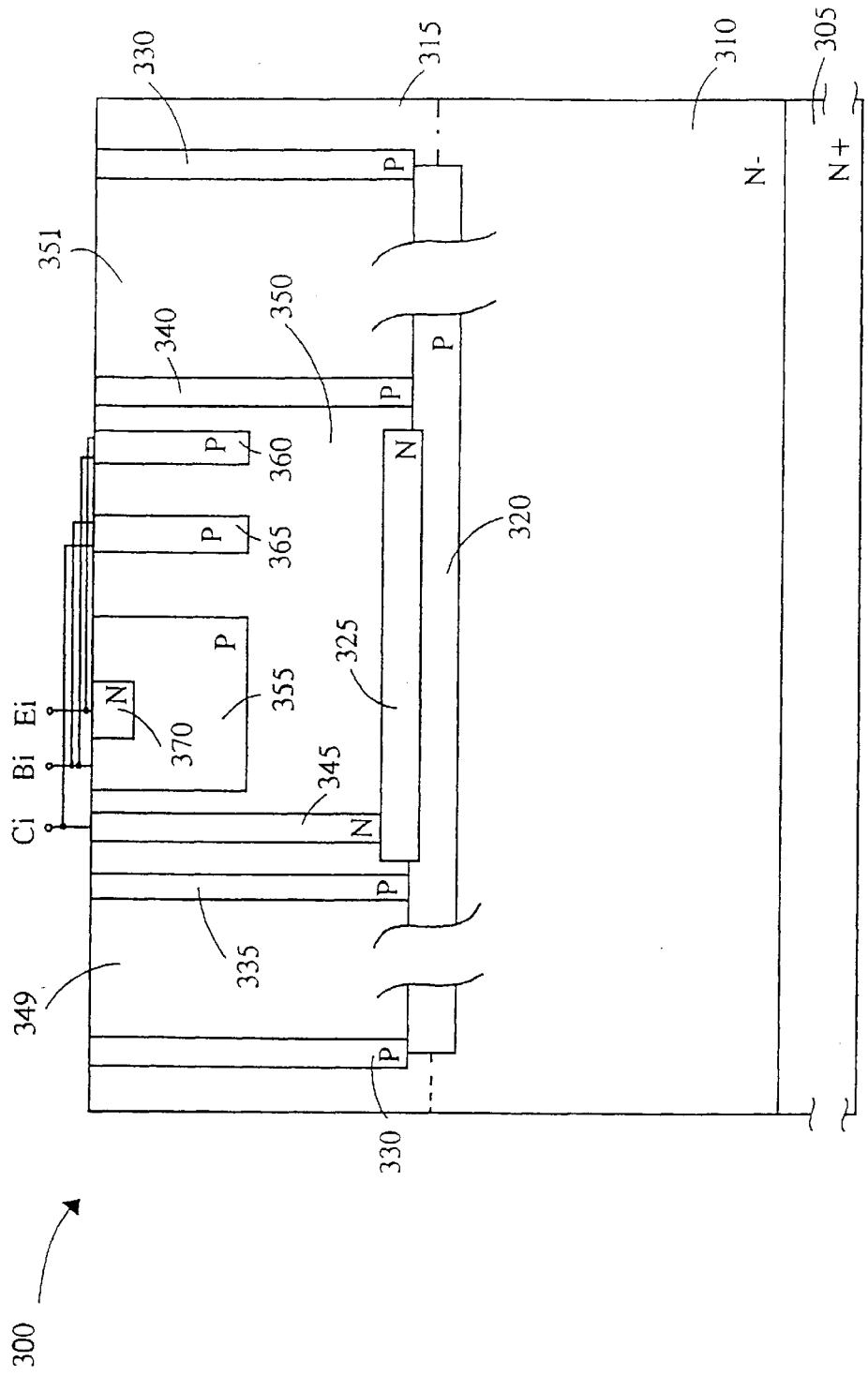
FIG. 3 shows an integrated circuit comprising the structure of FIG. 2.

With reference now to FIG. 3, this shows an integrated circuit comprising the structure of FIG. 2 and formed with the use of the VIPower process (VIPower is a trade mark of SGS-THOMSON MICROELECTRONICS S.r.l.). This is a mixed (signal and power) integrated circuit in which both the low-voltage control circuits and the high-voltage power devices are integrated on the same semiconductor chip.

In the VIPower process, the semiconductor chip is formed from a semiconductor substrate with a first type of conductivity on which an epitaxial layer doped with the same type of impurities is formed. The power transistors (bipolar or field-effect) are constructed with a structure with wholly vertical conduction in which the various P-N junctions are buried in the epitaxial layer. The collector or drain electrode is formed on the back of the chip, that is on the opposite face of the substrate to that with the epitaxial layer. The control circuitry, on the other hand is formed within one or more wells insulated by means of regions having a second type of conductivity and formed in the epitaxial layer. This construction process is described in European patent application EP-322040 in the name of SGS-THOMSON MICROELECTRONICS S.r.l., which is hereby incorporated by reference.

As usual, the concentrations of N- and P-type impurities are indicated by the addition of the + sign or the − sign to the letters N and P to indicate a high or low concentration of impurities, respectively; the letters N and P without the addition of + or − signs denote intermediate concentration values. With reference to the structure shown in the drawing, a first epitaxial layer 310 is formed by epitaxial growth on a substrate 305 of monocrystalline silicon strongly doped with N-type impurities (N+), the epitaxial layer 310 having the same type of conductivity N but with a low concentration of impurities (N−).

P-type regions having an intermediate concentration of impurities (P) are formed by implantation on the surface of the epitaxial layer 310. Regions with N-type doping are then formed on these P-type regions by a subsequent implantation step. A second, N-type epitaxial layer 315 having a concentration of impurities greater than or equal to that of the first layer 310 is formed thereon by epitaxial growth. In this stage, which takes place at high temperature, the implanted P-type and N-type regions described above extend by diffusion into the two epitaxial layers 310 and 315 giving rise to buried regions. In particular, a P-type region 320 forms a buried insulation region for an N-type well, whereas an N-type region 325 constitutes a buried collector region of the low-voltage NPN transistor Ti.

P-type regions having high concentrations of impurities are then formed in the second epitaxial layer 315 by known masking and diffusion techniques and extend through the entire second epitaxial layer. In particular, a P-type region 330 is connected to the buried P-type region 320 to complete the insulation region which defines an insulated N-type well. The P-type regions 335 and 340 are connected to the same buried P-type region 320, subdividing the insulated N-type well described above into a plurality of cells 349, 350 and 351 insulated from one another.

With reference to the insulated cell 350 in particular, (similar comments apply to the other insulated cells) an N-type region 345 with a high concentration of impurities is formed by implantation techniques (or alternatively by a deposition process) and diffusion techniques and extends into the second epitaxial layer 315 as far as the respective buried collector region 325 to form a deep collector contact of the vertical NPN transistor Ti. P-type regions are then implanted and diffused into the insulated cell 350 by similar techniques. A P-type region 355 defines the base region of the vertical NPN transistor Ti and P-type regions 360 and 365 define the resistors R1$i$ and R2$i$, respectively. Finally, a further high-concentration N-type region 370 is formed by implantation and diffusion within the region 355 and defines the emitter region of the vertical NPN transistor.

Metal strips are then formed by known deposition, masking and etching techniques, in contact with surface regions of the various components, on the front face of the chip, which is coated with a layer of silicon dioxide (not shown in the drawing). In particular, the two terminals of the resistor R1$i$ are connected to the emitter terminal (Ei) and to the base terminal (Bi) of the transistor Ti, respectively. Similarly, the two terminals of the resistor R2$i$ are connected to the collector terminal (Ci) of the transistor Ti and to the same base terminal (Bi).

It is known that each of the two resistors R1$i$ and R2$i$ integrated in the insulated N-type well 350 creates a parasitic PNP transistor defined by the P-type region 360 or 365, by the N-type well 350 and the buried N region 325, and by the buried P insulation region 320. However, since the collector terminal of the transistor Ti, and hence the buried N-type region 325, is conductive at a higher potential than that of the other regions constituting the Vbe multiplier in question, this parasitic transistor is always cut off so that the two resistors R1$i$ and R2$i$ thus integrated in the N-type well 350 do not activate any parasitic components.

Several Vbe multipliers can be integrated in respective insulated cells within a single P-type insulation region. The number of Vbe multipliers which can be integrated in the same insulated well depends upon the breakdown voltage of the P-N junction between the buried insulation region 320 and the buried collector regions (for example, region 325) of the various low-voltage transistors (typically below 50V). In order to insulate the low-voltage components from substrate 305, the P-N junction described above in fact has to be polarized in reverse. The buried P-type insulation region 320 is therefore connected (by means of region 330) to the terminal with the lowest potential present within it, that is, the emitter terminal of the transistor constituting the first Vbe multiplier. The voltage produced by the series of Vbe multipliers integrated within the insulated well is supplied between the emitter terminal of the first transistor (connected as mentioned above to the buried insulation region 320) and the collector terminal of the last transistor (connected to a buried N-type region in contact with the buried insulation region 320). As a result, the voltage supplied by the series of Vbe multipliers integrated within the same insulated well cannot exceed the breakdown voltage of the P-N junction formed between the buried P-type insulation region 320 and the buried N-type collector region of the last transistor. If a higher voltage is required, it is necessary to distribute the Vbe multipliers in two or more insulated wells suitably connected to one another by means of surface metal contacts. In the embodiment described above, in which the thermal compensation device has to supply a voltage of 100V, at least two insulated wells are therefore required.

Figure 4:
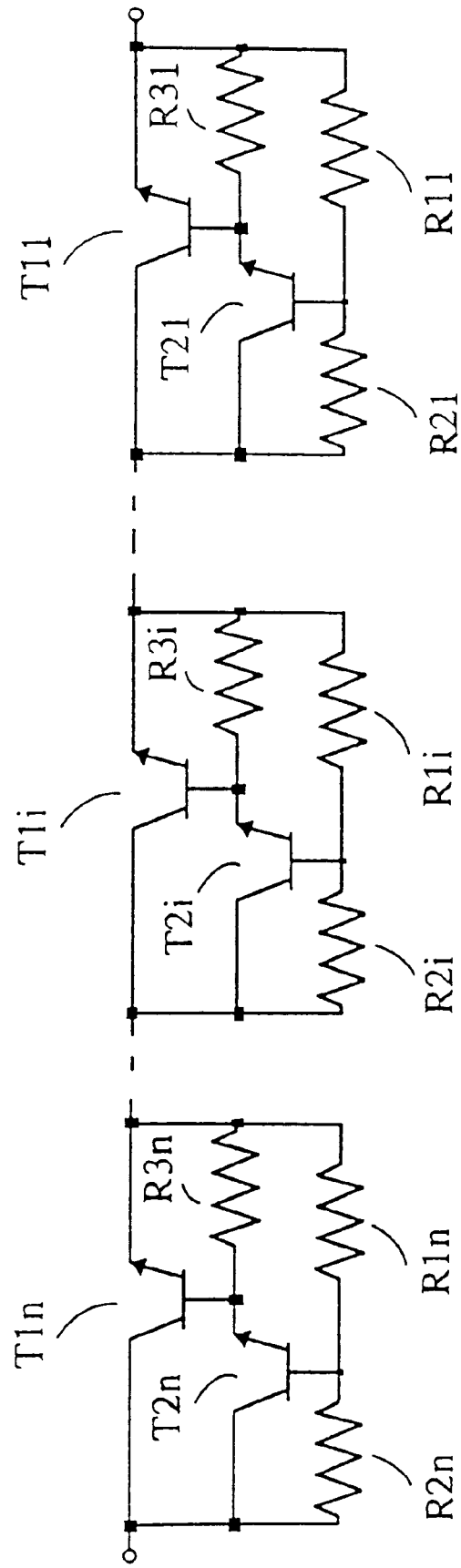
FIG. 4 is a circuit diagram corresponding to a different embodiment of the present invention using stages in a Darlington configuration.

With reference now to FIG. 4, this is a circuit diagram corresponding to a different embodiment of the present invention using stages in a Darlington configuration. The thermal compensation device shown in the drawing is constituted by a series of n Vbe multipliers, each comprising two low-voltage transistors having a common collector, the emitter of one transistor being operatively connected to the base of the other transistor. In particular, if the i-th Vbe multiplier is considered, a resistor R1$i$ is connected between an emitter terminal of a first low-voltage transistor T1$i$ and a base terminal of a second low-voltage transistor T2$i$ and a second resistor R2$i$ is connected between a collector terminal of the first transistor T1$i$ and the same base terminal of the transistor T2$i$. The collector terminal of the transistor T1$i$ is connected to a collector terminal of the transistor T2$i$. The transistor T1$i$ also has a base terminal connected to an emitter terminal of the transistor T2$i$.

Each pair of transistors (T1$i$ and T2$i$) connected in a Darlington configuration may be considered to be equivalent to a single transistor having a base-emitter threshold voltage equal to 2·Vbe. If the previous example, in which each individual Vbe multiplier supplies a voltage of 12.5 V, is considered:

$$12.5 = 2 \cdot 0.7 \cdot (1 + R2i/R1i)$$

from which the ratio between the resistances of the two resistors R2$i$ and R1$i$ is:

$$R2i/R1i = 7.9$$

The use of a pair of transistors in a Darlington configuration thus reduces the ratio between the resistances of the two resistors R2*i* and R1*i*. In this embodiment of the present invention, it is therefore possible to form the various resistors with a better level of accuracy of the ratios between them, producing a more accurate thermal compensation device.

In the circuit shown in the drawing, each Vbe multiplier also includes an "anti-leakage" resistor. In particular, in the i-th Vbe multiplier, there is a resistor R3*i* connected between the base terminal and the emitter terminal of the transistor T1*i*. In an integrated circuit comprising the structure described above, currents may in fact arise due to structural leakages. In particular, the current injected into the base terminal of the transistor T1*i* may cause undesired switching-on thereof. The resistor R3*i* connected between the base and emitter terminals of the transistor T1*i* enables this current to be "shunted." If the resistor R3*i* is of a size such that the voltage drop therein is always less than the threshold voltage Vbe of the transistor T1*i*, undesired switching-on of the transistor is prevented. Typical values of the resistances of these "anti-leakage" resistors are from a few hundreds of $\Omega$ to a few tens of k$\Omega$.

Figure 5:
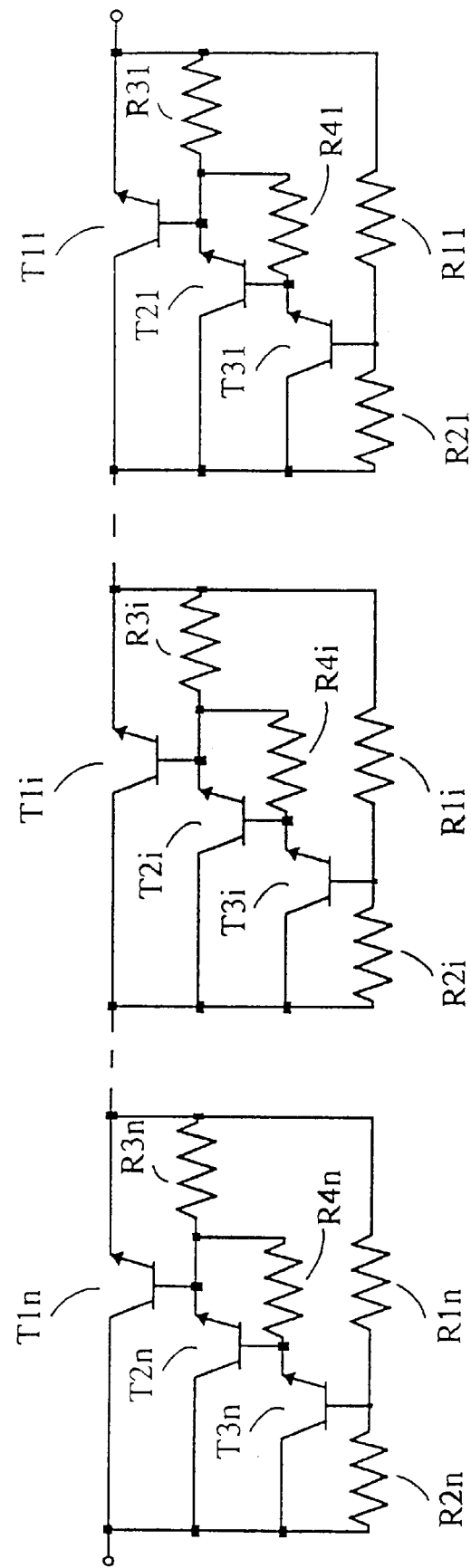
FIG. 5 is a circuit diagram corresponding to a preferred embodiment of the present invention, using stages with three transistors in a Darlington configuration.

An even lower value of the ratio between the resistances of the two resistors R2*i* and R1*i* is achieved with the use of three low-voltage transistors in a Darlington configuration for each individual Vbe multiplier, as shown in FIG. 5. The thermal compensation device shown in this drawing is constituted by the series of n Vbe multipliers, each comprising three low-voltage transistors. With reference to the i-th Vbe multiplier, the three transistors T1*i*, T2*i* and T3*i* are connected in a Darlington configuration, that is, with a common collector and with the emitter of one transistor operably connected to the base of the next transistor. The first resistor R1*i* is connected between an emitter terminal of the transistor T1*i* and a base terminal of the transistor T3*i* and the second resistor R2*i* is connected between a collector terminal of the transistor T1*i* and the same base terminal of the transistor T3*i*.

In this case, the three transistors are equivalent to a single transistor having a base-emitter threshold voltage equal to 3·Vbe so that, if the same example as above is considered:

$$12.5 = 3 \cdot 0.7 \cdot (1 + R2i/R1i)$$

from which:

$$R2i/R1i = 4.9$$

As in the previous embodiment, respective "anti-leakage" resistors R3*i* and R4*i* are connected between the base and emitter terminals of the transistors T1*i* and T2*i*, to prevent undesired switching-on of these transistors because of currents caused by structural leakages of the circuit.

Experts in the art will appreciate that the thermal compensation device according to the present invention can be also be formed in a manner similar to that described above, with Vbe multipliers comprising 4 or more transistors in a Darlington configuration.

Figure 6:
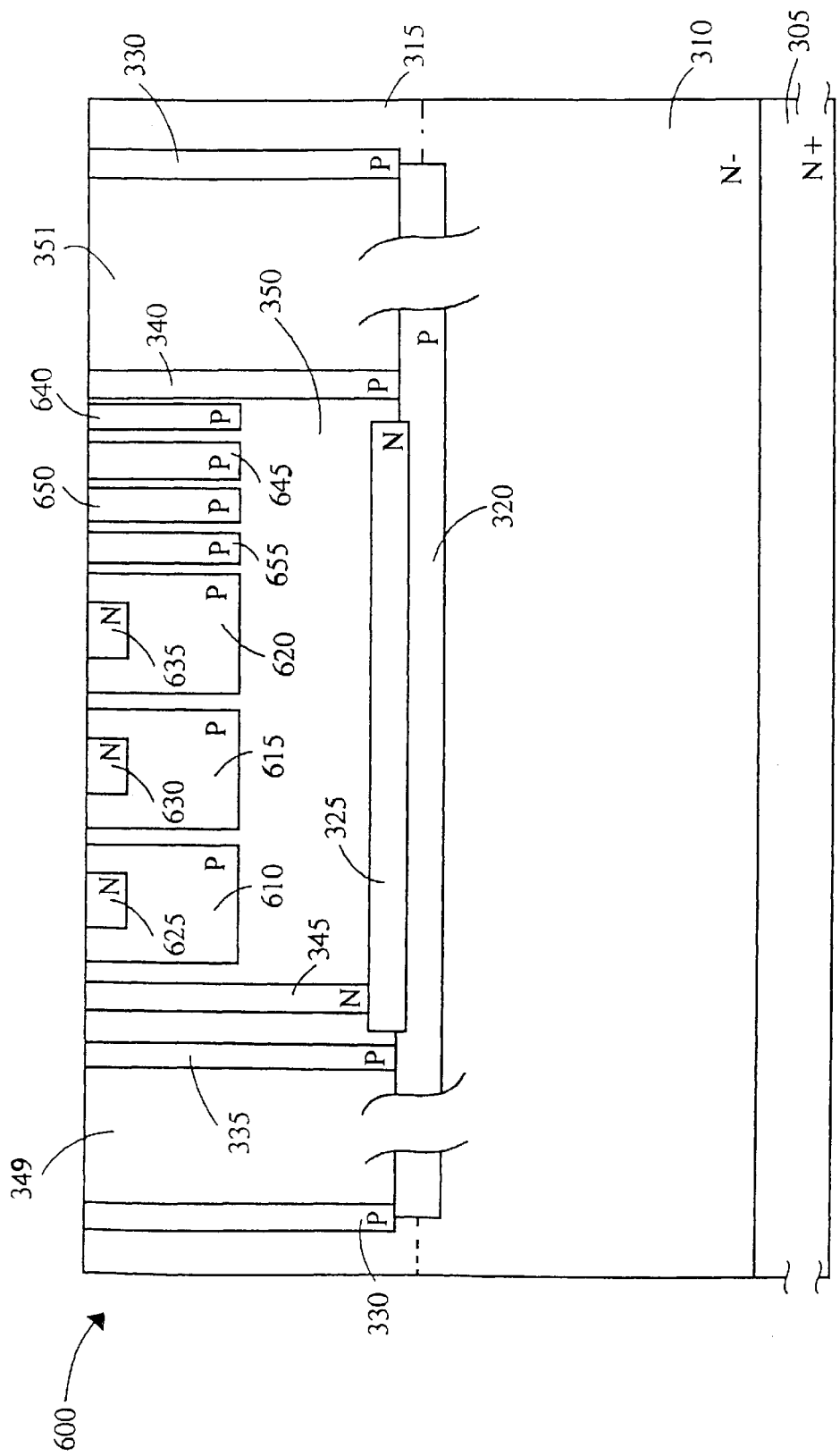
FIG. 6 shows an integrated circuit including the structure of FIG. 5.

An integrated circuit comprising the structure of FIG. 5 is shown in FIG. 6. As in the previous embodiment, the integrated circuit 600 shown in the drawing is formed on an N+ substrate 305 on which an N epitaxial layer 310–315 is grown. An insulated well is formed within the epitaxial layer 310–315 by means of a P-type insulation region (constituted by a buried region 320 and a contact region 330) and is subdivided into a plurality of insulated cells by means of P-type regions 335 and 340. The low-voltage transistors T1*i*, T2*i* and T3*i* and the resistors R1*i*, R2*i*, R3*i* and R4*i* are shown in an insulated cell 350. In this insulated cell 350 there is a buried N-type region 325 and an N-type region 345 which extends from the surface of the chip to contact the buried region 325. The N-type region 325 constitutes the buried collector region of the three transistors T1*i*, T2*i* and T3*i*. Within the insulated well 350 are the base regions of the transistors T1*i*, T2*i* and T3*i* constituted by respective P-type regions 610, 615 and 620. The emitter regions of the transistors T1*i*, T2*i* and T3*i*, are formed by respective N-type regions 625, 630 and 635, formed within the P-type regions 610, 615 and 620. The resistors R1*i*, R2*i*, R3*i* and R4*i* are formed by respective P-type regions 640, 645, 650 and 655 formed within the insulated well 350 which is common to the three transistors T1*i*, T2*i* and T3*i*. The various components of the integrated circuit are suitably interconnected by means of surface metal contacts (not shown in the drawing).

It will be noted that the embodiment of the present invention shown in FIGS. 5 and 6 is particularly advantageous since it takes up less space on the semiconductor chip than the embodiments described above, further limiting the dimensions of the device.

Figure 7:
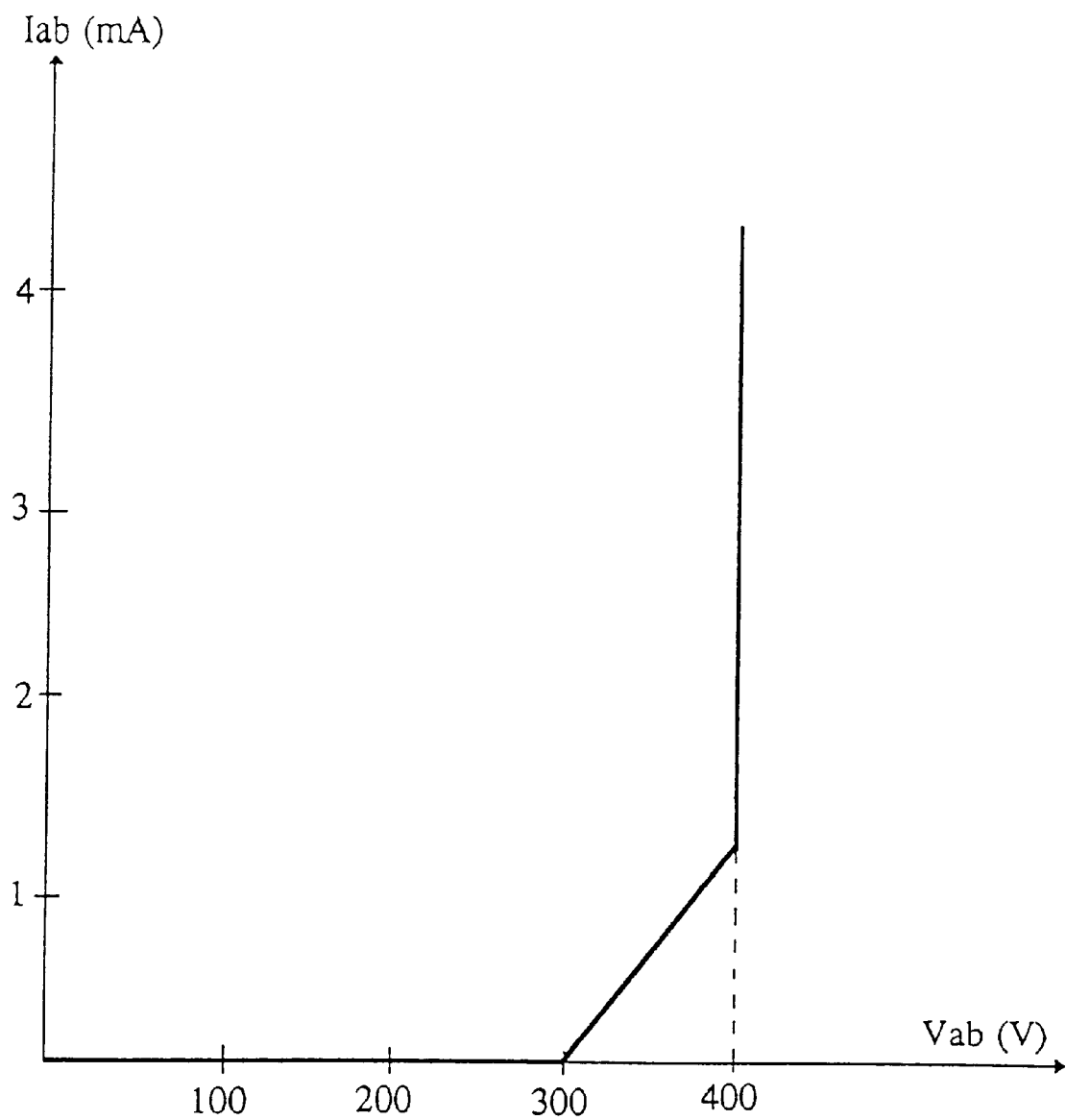
FIG. 7 shows graphically the voltage-current characteristic of a zener chain with temperature compensation by means of the device according to the present invention.

With reference now to FIG. 7, this shows graphically the voltage-current characteristic of a zener chain compensated for temperature by means of the device according to the present invention. The graph shows the variation of the current Iab (in mA) between the two terminals of the device (zener chain plus Vbe multipliers) as a function of the voltage Vab (in V) applied to the same terminals; the foregoing numerical example is considered, in which, of a total voltage of 400V, 300V of which is supplied by the zener chain and 100V by the thermal compensation device.

As can be seen, as long as the voltage Vab is below 300V, the entire device is non-conductive so that the current Iab is zero. When the voltage Vab reaches 300 v, the zener chain becomes conductive and a current starts to flow through the resistive path formed by the various resistors present in the thermal compensation device, the transistors of which are still cut off. With reference, for example, to the circuit of FIG. 2, a resistive path is formed by the series of resistors R11–R2n. It will be noted that this current has to be small enough (a few mA) not to create malfunctions in the circuit. For example, if this circuit is used in the electronic-ignition integrated circuit already described, this current has to be small enough not to switch the power transistor on again. When the voltage Vab reaches 400V, the transistors constituting the series of Vbe multipliers become conductive so that the voltage is kept substantially constant irrespective of the current Iab.

Although the present invention and its advantages have been described in detail, it should be understood that various changes, substitutions and alterations can be made herein without departing from the spirit or scope of the invention as defined in the appended claims.

What is claimed is:

1. A monolithic integrated semiconductor circuit comprising:

a reverse-conduction threshold device having a predetermined reverse-conduction threshold;

a thermal compensation device connected in series with said reverse-conduction threshold device, said thermal compensation device comprising a plurality of Vbe multipliers connected in series with one another, each of said Vbe multipliers comprising:

a resistive divider comprising first and second resistors connected in series between a first terminal and a second terminal of the Vbe multiplier, and a first transistor having an emitter terminal and a collector terminal connected, respectively, to said first and second terminals of said Vbe multiplier, and a base terminal connected to an intermediate tap of said divider.

2. An integrated circuit according to claim 1, wherein said base terminal of said first transistor is connected to said intermediate tap of said divider by a second transistor having an emitter terminal and a collector terminal connected to said base terminal and to said collector terminal of said first transistor, respectively, and a base terminal connected to said intermediate tap of said divider.

3. An integrated circuit according to claim 2, wherein said base terminal of said second transistor is connected to said intermediate tap of said divider by a third transistor having an emitter terminal and a collector terminal connected to said base terminal and to said collector terminal of said second transistor, respectively, and a base terminal connected to said intermediate tap of said divider.

4. An integrated circuit according to claim 3, wherein each of said Vbe multipliers comprises a fourth resistor connected between said base terminal and said emitter terminal of said second transistor.

5. An integrated circuit according to claim 2, wherein each of said Vbe multipliers comprises a third resistor connected between said base terminal and said emitter terminal of said first transistor.

6. An integrated circuit according to claim 5, wherein said base terminal of said second transistor is connected to said intermediate tap of said divider by a third transistor having an emitter terminal and a collector terminal connected to said base terminal and to said collector terminal of said second transistor, respectively, and a base terminal connected to said intermediate tap of said divider.

7. An integrated circuit according to claim 6, wherein each of said Vbe multipliers comprises a fourth resistor connected between said base terminal and said emitter terminal of said second transistor.

8. An integrated circuit according to claim 1, wherein said reverse-conduction threshold device comprises one or more zener diodes connected to one another in series.

9. An integrated circuit according to claim 1, wherein said integrated circuit is formed in a chip of semiconductor material having a first type of conductivity, comprising at least one well having said first type of conductivity, insulated by a first buried region having a second type of conductivity and of a first contact region having said second type of conductivity extending from a surface of said chip to contact said first buried region, said well being subdivided into a plurality of cells insulated from one another by further contact regions having said second type of conductivity extending from said surface to contact said first buried region, at least one of said cells comprising:

a second buried region having said first type of conductivity forming a buried junction with said first buried region and a second contact region having said first type of conductivity extending from said surface to contact said second buried region;

a first region having said second type of conductivity extending from said surface into said cell and a second region having said first type of conductivity extending from said surface into said first region, said cell, said first region and said second region constituting said collector, base and emitter of said first transistor, respectively; and a third region and a fourth region having said second type of conductivity extending from said surface into said cell and constituting said first resistor and said second resistor, respectively.

10. An integrated circuit according to claim 9, wherein the base terminal of said first transistor is connected to said intermediate tap of said divider by a second transistor having an emitter terminal and a collector terminal connected to said base terminal and to said collector terminal of said first transistor, respectively, and a base terminal connected to said intermediate tap of said divider.

11. An integrated circuit according to claim 10, wherein each of said Vbe multipliers comprises a third resistor connected between said base terminal and said emitter terminal of said first transistor.

12. An integrated circuit according to claim 11, wherein said insulated cell comprises:

a fifth region having said second type of conductivity extending from said surface into said cell and a sixth region having said first type of conductivity extending from said surface into said fifth region, said cell, said fifth region and said sixth region constituting said collector, base and emitter regions of said second transistor, respectively; and a seventh region having said second type of conductivity extending from said surface into said cell and constituting said third resistor.

13. An integrated circuit according to claim 12, wherein said base terminal of said second transistor is connected to said intermediate tap of said divider by a third transistor having an emitter terminal and a collector terminal connected to said base terminal and to said collector terminal of said second transistor, respectively, and a base terminal connected to said intermediate tap of said divider.

14. An integrated circuit according to claim 13, wherein each of said Vbe multipliers comprises a fourth resistor connected between said base terminal and said emitter terminal of said second transistor.

15. An integrated circuit according to claim 14, wherein said insulated cell comprises:

an eighth region having said second type of conductivity extending from said surface into said cell and a ninth region having said first type of conductivity extending from said surface into said eighth region, said cell, said eighth region and said ninth region constituting said collector, base and emitter regions of said third transistor, respectively; and a tenth region having said second type of conductivity extending from said surface into said cell and constituting said fourth resistor.

* * * * *